United States Patent
Gerstler et al.

(10) Patent No.: US 10,209,009 B2
(45) Date of Patent: Feb. 19, 2019

(54) HEAT EXCHANGER INCLUDING PASSAGEWAYS

(71) Applicant: General Electric Company, Schenectady, NY (US)

(72) Inventors: William Dwight Gerstler, Niskayuna, NY (US); Thomas Kupiszewski, Liberty Township, OH (US); Michael Thomas Kenworthy, Gilbert, AZ (US); Daniel Jason Erno, Clifton Park, NY (US)

(73) Assignee: General Electric Company, Schenectady, NY (US)

( * ) Notice: Subject to any disclaimer, the term of this patent is extended or adjusted under 35 U.S.C. 154(b) by 4 days.

(21) Appl. No.: 15/397,234

(22) Filed: Jan. 3, 2017

(65) Prior Publication Data
US 2017/0367218 A1 Dec. 21, 2017

Related U.S. Application Data

(60) Provisional application No. 62/352,862, filed on Jun. 21, 2016.

(51) Int. Cl.
| | |
|---|---|
| *F28D 7/02* | (2006.01) |
| *F28D 15/04* | (2006.01) |
| *F28D 9/00* | (2006.01) |
| *F28F 7/02* | (2006.01) |
| *F28D 15/02* | (2006.01) |

(Continued)

(52) U.S. Cl.
CPC ............ *F28D 15/04* (2013.01); *F28D 7/0025* (2013.01); *F28D 7/0066* (2013.01); *F28D 9/0093* (2013.01); *F28D 15/0233* (2013.01); *F28D 15/0266* (2013.01); *F28D 15/0275* (2013.01); *F28D 20/021* (2013.01); *F28F 1/045* (2013.01); *F28F 7/02* (2013.01); *H01L 23/427* (2013.01); *H05K 7/20309* (2013.01); *H05K 7/20318* (2013.01); *H05K 7/20336* (2013.01); *F28F 2270/00* (2013.01)

(58) Field of Classification Search
CPC .............. H05K 7/20327; H05K 1/0203; F28D 9/0093; F28F 7/02; F25B 4/00; C03B 7/02718
USPC .......................................................... 165/164
See application file for complete search history.

(56) References Cited

U.S. PATENT DOCUMENTS

| | | |
|---|---|---|
| 4,700,773 A | 10/1987 | Kehrer |
| 4,915,164 A | 4/1990 | Harper |

(Continued)

FOREIGN PATENT DOCUMENTS

| | | |
|---|---|---|
| DE | 2837802 A1 | 8/1979 |
| WO | 2016057471 A1 | 4/2016 |

*Primary Examiner* — Davis Hwu
(74) *Attorney, Agent, or Firm* — Ernest G. Cusick; Frank A. Landgraff

(57) ABSTRACT

A heat exchanger includes a core defining a first passageway and a second passageway. The core includes a plurality of unit cells coupled together. Each unit cell of the plurality of unit cells includes a first wall and a second wall. The second wall is spaced from the first wall. The first wall at least partially defines a first passageway portion and a second passageway portion. The second wall at least partially defines the second passageway portion. The second wall extends about the first wall such that the first passageway portion is nested within the second passageway portion.

18 Claims, 9 Drawing Sheets

(51) Int. Cl.
  *H05K 7/20*    (2006.01)
  *F28D 7/00*    (2006.01)
  *F28D 20/02*   (2006.01)
  *F28F 1/04*    (2006.01)
  *H01L 23/427*  (2006.01)

(56) References Cited

U.S. PATENT DOCUMENTS

| | | |
|---|---|---|
| 6,378,605 B1 | 4/2002 | Kutscher et al. |
| 7,032,654 B2 | 4/2006 | Wand et al. |
| 7,871,578 B2 | 1/2011 | Schmidt |
| 8,109,324 B2 | 2/2012 | Farid et al. |
| 2004/0251006 A1* | 12/2004 | Marin ............... C03B 37/02718 165/157 |
| 2008/0149299 A1 | 6/2008 | Slaughter |
| 2012/0036886 A1* | 2/2012 | Seybold ................. F25B 40/00 62/498 |
| 2013/0206374 A1 | 8/2013 | Roisin et al. |
| 2014/0014493 A1 | 1/2014 | Ryan |
| 2014/0251585 A1 | 9/2014 | Kusuda et al. |
| 2016/0116218 A1 | 4/2016 | Shedd et al. |
| 2016/0202003 A1 | 7/2016 | Gerstler et al. |

* cited by examiner

HEAT EXCHANGER INCLUDING PASSAGEWAYS

CROSS REFERENCE TO RELATED APPLICATIONS

This application claims the priority of provisional Patent Application Ser. No. 62/352,862 entitled "ELECTRONICS COOLING WITH MULTI-PHASE HEAT EXCHANGE AND HEAT SPREADER", which was filed on Jun. 21, 2016, and which is hereby incorporated by reference in its entirety.

BACKGROUND

The present disclosure relates generally to heat exchangers and, more specifically, heat exchangers including nested passageways.

At least some known heat exchangers utilize heat transfer fluids that flow through the heat exchangers and transfer heat. A heat transfer efficiency of the heat exchangers is determined, at least in part, by the flow of the heat transfer fluids through the heat exchangers. As the heat transfer fluids flow through the heat exchangers, the heat transfer fluids tend to establish a boundary layer which increases thermal resistance and reduces the heat transfer efficiency of the heat exchangers. In addition, the heat transfer efficiency of the heat exchangers is affected by characteristics of the heat exchanger such as material properties, surface areas, flow configurations, pressure drops, and resistivity to thermal exchange. Improving any of these characteristics facilitates increasing a heat transfer efficiency of the heat exchanger.

In addition, some systems or applications require heat exchangers to fit within a specified system volume and weigh less than a specified weight. However, reducing the size of the heat exchangers to meet system requirements affects the characteristics that determine heat transfer efficiency. Also, at least some heat exchangers are not properly shaped to fit within the systems, which results in ineffective use of space and/or wasted volume. Moreover, at least some known heat exchangers are formed to meet system requirements using fabrication techniques that require multiple joints, such as brazed and welded joints. Such joints may deteriorate over time, thereby decreasing a service life of the heat exchangers.

BRIEF DESCRIPTION

In one aspect, a heat exchanger is provided. The heat exchanger includes a core defining a first passageway and a second passageway. The core includes a plurality of unit cells coupled together. Each unit cell of the plurality of unit cells includes a first wall and a second wall. The second wall is spaced from the first wall. The first wall at least partially defines a first passageway portion and a second passageway portion. The second wall at least partially defines the second passageway portion. The second wall extends about the first wall such that the first passageway portion is nested within the second passageway portion.

In another aspect, an electronic device is provided. The electronic device includes a circuit board and electronic components mounted on the circuit board. The electronic device also includes a heat exchanger coupled to the circuit board to transfer heat generated by the electronic components. The heat exchanger includes a first passageway for a first fluid to flow through and a second passageway for a second fluid to flow through. The first passageway is nested within the second passageway.

In yet another aspect, a heat exchanger is provided. The heat exchanger includes a core defining a first passageway for a first fluid to flow through and a second passageway for a second fluid to flow through. The core includes a first unit cell including a first sidewall and a second sidewall. The first sidewall at least partially defines a first passageway first portion and a second passageway first portion. The second sidewall at least partially defines the second passageway first portion. The second sidewall extends about the first sidewall such that the first passageway first portion is nested within the second passageway first portion. The core also includes a second unit cell including a third sidewall at least partially defining a first passageway second portion and a second passageway second portion. The second unit cell is coupled to the first unit cell. The first unit cell is configured to enable the first fluid to flow from the first passageway first portion to the first passageway second portion.

DRAWINGS

These and other features, aspects, and advantages of the present disclosure will become better understood when the following detailed description is read with reference to the accompanying drawings in which like characters represent like parts throughout the drawings, wherein.

Unless otherwise indicated, the drawings provided herein are meant to illustrate features of embodiments of the disclosure. These features are believed to be applicable in a wide variety of systems including one or more embodiments of the disclosure. As such, the drawings are not meant to include all conventional features known by those of ordinary skill in the art to be required for the practice of the embodiments disclosed herein.

DETAILED DESCRIPTION

In the following specification and the claims, reference will be made to a number of terms, which shall be defined to have the following meanings.

The singular forms "a", "an", and "the" include plural references unless the context clearly dictates otherwise.

"Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about," "substantially," and "approximately," are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise.

As used herein, the term "fluid" includes any medium or material that flows, including, but not limited to, air, gas, liquid, and steam.

The systems and methods described herein include a core that enables heat exchangers to have different shapes, sizes, and flow configurations. The core includes a plurality of unit cells. The unit cells define passageways for at least two different heat exchange fluids such that the fluids combine and divide in close proximity separated only by sidewalls. In addition, the core is configured such that at least some portions of the passageways are nested. For example, in some embodiments, each unit cell defines a first passageway portion that is nested within a second passageway portion. As a result, the core has an increased ratio of surface area to volume. Accordingly, at least some heat exchangers including the core have a decreased volume and increased heat transfer efficiency.

Figure 1:
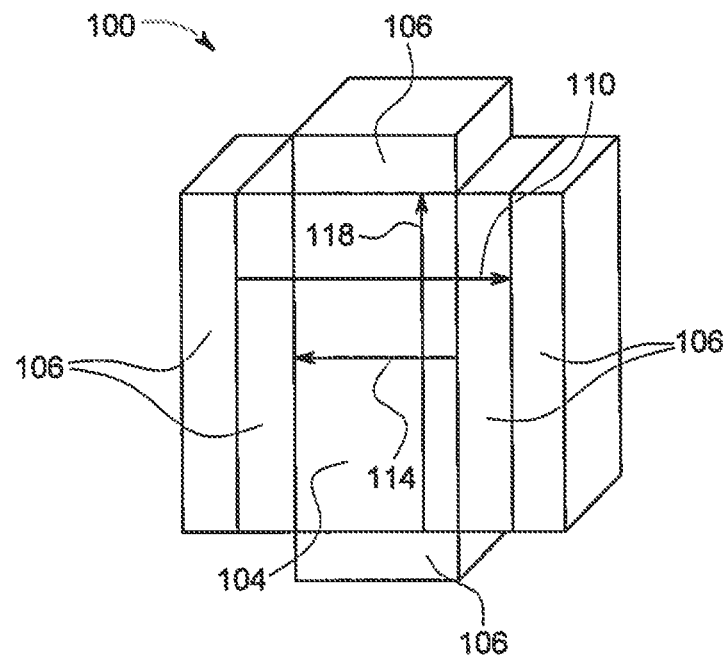
FIG. 1 is a schematic view of an exemplary heat exchanger.
Figure 2:
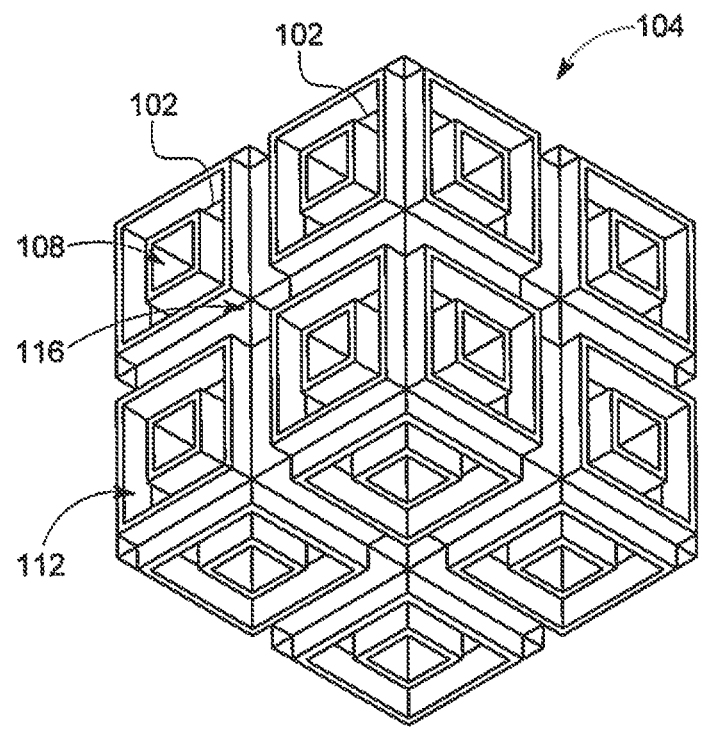
FIG. 2 is an isometric view of a plurality of unit cells of the heat exchanger shown in FIG. 1.

FIG. 1 is a schematic view of an exemplary heat exchanger 100. FIG. 2 is an isometric view of a plurality of unit cells 102 of heat exchanger 100. Heat exchanger 100 includes a core 104 and manifold portions 106. Core 104 includes a plurality of unit cells 102 defining a first passageway 108 for a first fluid 110 to flow through, a second passageway 112 for a second fluid 114 to flow through, and a third passageway 116 for a third fluid 118 to flow through. As first fluid 110, second fluid 114, and third fluid 118 flow through heat exchanger 100, heat is transferred by first fluid 110, second fluid 114, and third fluid 118. In alternative embodiments, heat exchanger 100 has any configuration that enables heat exchanger 100 to operate as described herein.

During operation of heat exchanger 100, first fluid 110 flows into first passageway 108 from manifold portion 106 and is directed through core 104. After flowing through first passageway 108, first fluid 110 flows into manifold portion 106 and is discharged from heat exchanger 100. Second fluid 114 flows into second passageway 112 from manifold portion 106 and is directed through core 104. After flowing through second passageway 112, second fluid 114 flows into manifold portion 106 and is discharged from heat exchanger 100. Third fluid 118 flows into third passageway 116 from manifold portion 106 and is directed through core 104. After flowing through first passageway 108, third fluid 118 flows into manifold portion 106 and is discharged from heat exchanger 100. In alternative embodiments, any fluid flows through heat exchanger 100 that enables heat exchanger 100 to operate as described herein. For example, in some embodiments, a fourth fluid flows through heat exchanger 100. In some embodiments, first fluid 110, second fluid 114, and/or third fluid 118 is omitted. In further embodiments, at least one of first passageway 108, second passageway 112, and third passageway 116 contains a vacuum. In some embodiments, manifold portion 106 is configured to keep first fluid 110, second fluid 114, and/or third fluid 118 separate. In further embodiments, manifold portion 106 is configured to direct a single fluid into two or more fluid domains.

Moreover, in the exemplary embodiment, core 104 is configured such that first fluid 110, second fluid 114, and third fluid 118 exchange heat as first fluid 110, second fluid 114, and third fluid 118 flow through core 104 and manifold portion 106. For example, first fluid 110, second fluid 114, and third fluid 118 exchange heat through sidewalls of unit cells 102 as first fluid 110, second fluid 114, and third fluid 118 flow through portions of first passageway 108, second passageway 112, and third passageway 116. As described in more detail below, unit cells 102 define portions of first passageway 108, second passageway 112, and third passageway 116 where first fluid 110, second fluid 114, and third fluid 118 combine and divide to disrupt thermal boundary layers in first fluid 110, second fluid 114, and third fluid 118. In addition, portions of first passageway 108 are nested within second passageway 112. In the exemplary embodiment, unit cells 102 are aligned and coupled together such that core 104 is substantially symmetrical, which facilitates multiple flow configurations of heat exchanger 100. For example, in the illustrated embodiment, core 104 has a diamond shape. In alternative embodiments, core 104 has any configuration that enables heat exchanger 100 to operate as described herein.

In some embodiments, core 104 is divided up into independent zones. Unit cells 102 facilitate sectioning and/or segmenting core 104 into the independent zones. In further embodiments, heat exchanger 100 includes a plurality of discrete cores 104. The repeating geometric shapes of unit cells 102 facilitate core 104 coupling to other cores 104 in multiple different configurations. In some embodiments, heat exchanger 100 includes a segment (not shown) linking separate cores 104 such that a portion of fluid flows through the segment between cores 104.

Heat exchanger 100 is configured such that first fluid 110, second fluid 114, and third fluid 118 flow through core 104 in multiple directions. In particular, manifold portion 106 is configured and/or coupled to core 104 in different locations such that first fluid 110, second fluid 114, and third fluid 118 are directed through core 104 in different directions. Core 104 does not have to change shape, size, and/or arrangement of unit cells 102 to accommodate different locations and configurations of manifold portions 106. Moreover, the different configurations of core 104 and manifold portion 106 enable heat exchanger 100 to meet specific system requirements, such as shape, space, and piping requirements. For example, in some embodiments, manifold portions 106 are coupled to specific locations on core 104 that enable heat exchanger 100 to fit different spaces, shapes, and/or piping connections. In further embodiments, unit cells 102 are coupled together to form core 104 having a desired shape and flow configuration. In alternative embodiments, core 104 and manifold portion 106 have any configuration that enables heat exchanger 100 to operate as described herein. For example, in some embodiments, at least a portion of first fluid 110, second fluid 114, and/or third fluid 118 is replaced with an at least partially solid substance configured to accommodate thermal shocks, such as wax, fusible alloy, and/or molten salt. As used herein, the term thermal shock refers to a variation in temperature that causes stress in a material. In further embodiments, at least one of first fluid 110, second fluid 114, and third fluid 118 is omitted. In further embodiments, four or more fluids flow through heat exchanger 100.

In the exemplary embodiment, heat exchanger 100 is configured such that first fluid 110 and second fluid 114 flow through core 104 in a counter-flow configuration. In the counter-flow configuration, first fluid 110 and second fluid 114 flow through core 104 in substantially opposed directions. Heat exchanger 100 is configured such that third fluid 118 flows through core 104 in a cross-flow configuration relative to first fluid 110 and second fluid 114. In the cross-flow configuration, third fluid 118 flows through core in a direction substantially perpendicular to first fluid 110 and second fluid 114. In alternative embodiments, first fluid 110, second fluid 114, and third fluid 118 flow in any directions that enable heat exchanger 100 to operate as described herein. For example, in some embodiments, heat exchanger 100 is configured such that first fluid 110, second fluid 114, and/or third fluid 118 flow in counter-flow directions, parallel-flow directions, cross-flow directions, and hybrids thereof. In hybrid flow configurations, first fluid 110, second fluid 114, and/or third fluid 118 change direction within core such that the flow configuration differs in different portions of core 104.

Also, in the exemplary embodiment, core 104 is manufactured using an additive manufacturing process. An additive manufacturing process facilitates core 104 having complex geometries while limiting the number of joints of core 104. In alternative embodiments, core 104 is formed in any manner that enables heat exchanger 100 to operate as described herein.

Figure 3:
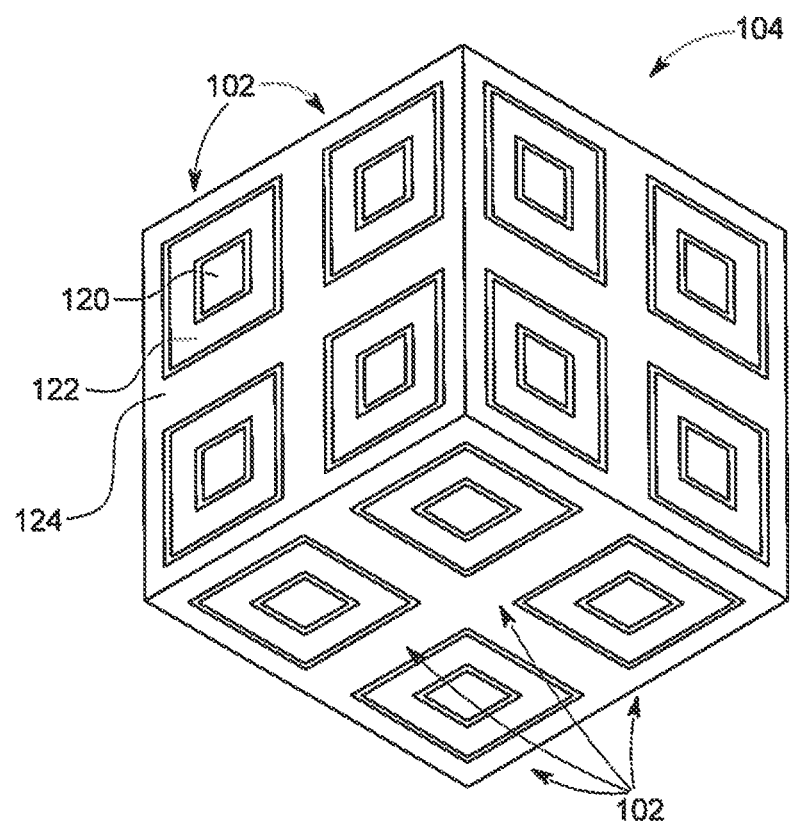
FIG. 3 is a schematic perspective view of fluid domains of the plurality of the unit cells shown in FIG. 3.

FIG. 3 is a schematic perspective view of fluid domains of the plurality of unit cells 102. In the exemplary embodiment, unit cells 102 form nested fluid domains. In particular, each unit cell 102 forms a first fluid domain 120, a second fluid domain 122, and a third fluid domain 124. First fluid domain 120 is nested within second fluid domain 122. Accordingly, unit cell 102 has a first-degree nested order. As a result, the ratio of surface area to volume of unit cells 102 is increased in comparison to unit cells without nested fluid domains. In alternative embodiments, unit cells 102 define any fluid domain that enables heat exchanger 100 (shown in FIG. 1) to operate as described herein.

Figure 4:
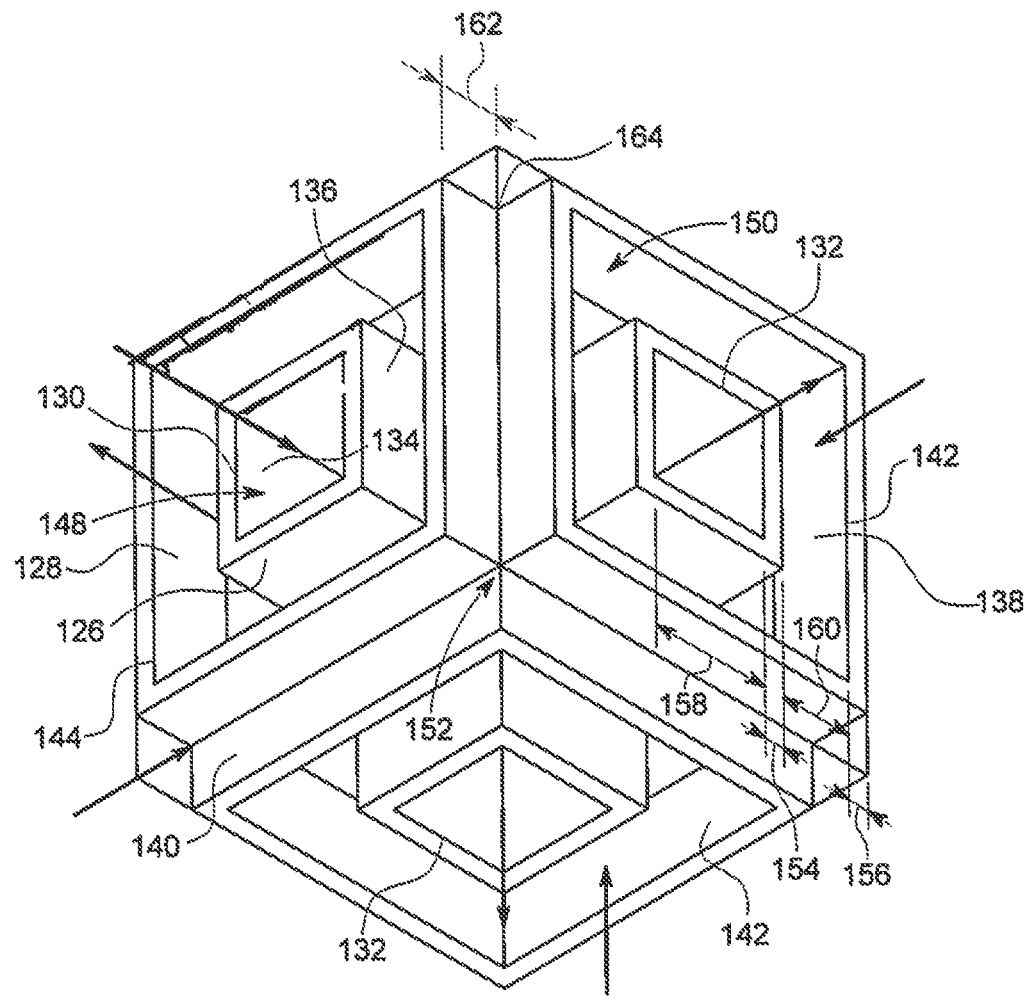
FIG. 4 is a schematic perspective view of a unit cell of the heat exchanger shown in FIG. 1.

FIG. 4 is a schematic perspective view of a unit cell 102 of heat exchanger 100. In some embodiments, core 104 includes some unit cells 102 that differ in some aspects from unit cells 102 shown in FIGS. 2-4. In the exemplary embodiment, each unit cell 102 includes a first sidewall 126 and a second sidewall 128. First sidewall 126 defines a plurality of unit cell first inlets 130, a plurality of unit cell first outlets 132, a first interior surface 134, and a first exterior surface 136. Second sidewall 128 surrounds first sidewall 126 and is spaced from first sidewall 126. Second sidewall 128 defines a second interior surface 138 and a second exterior surface 140. In addition, first sidewall 126 and second sidewall 128 define a plurality of unit cell second inlets 142 and a plurality of unit cell second outlets 144. In particular, unit cell second inlets 142 and unit cell second outlets 144 are defined between first sidewall 126 and second sidewall 128. As described in more detail below, second sidewall 128 provides additional surface area and increases the surface area to volume ratio of heat exchanger 100 (shown in FIG. 1) due to the nested structure of unit cell 102. In alternative embodiments, unit cell 102 includes any sidewall that enable heat exchanger 100 to operate as described herein.

During operation, first fluid 110 flows into unit cell 102 through unit cell first inlets 130, contacts first interior surface 134, and flows out of unit cell 102 through unit cell first outlets 132. Second fluid 114 flows into unit cell 102 through unit cell second inlets 142, contacts second interior surface 138 and first exterior surface 136, and flows out of unit cell 102 through unit cell second outlets 144. Third fluid 118 flows past unit cell 102 such that third fluid 118 contacts second exterior surface 140. In the exemplary embodiment, each unit cell 102 has three unit cell first inlets 130, three unit cell first outlets 132, three unit cell second inlets 142, and three unit cell second outlets 144. In alternative embodiments, unit cell 102 has any unit cell inlet 130 and unit cell outlet 132 that enable heat exchanger 100 to operate as described herein.

Also, in the exemplary embodiment, each unit cell 102 forms a first passageway portion 148 of first passageway 108, a second passageway portion 150 of second passageway 112, and a third passageway portion 152 of third passageway 116. First passageway portion 148, second passageway portion 150, and third passageway portion 152 are configured for first fluid 110, second fluid 114, and third fluid 118 to exchange thermal energy through first sidewall 126 and second sidewall 128. In operation, first fluid 110 flows into first passageway portion 148 from other first passageway portions 148 associated with other unit cells 102. First passageway portion 148 furcates such that first fluid 110 flows out of first passageway portion 148 towards further first passageway portions 148. In particular, first passageway portion 148 trifurcates such that first fluid 110 flows into three flow paths towards three different first passageway portions 148. Second fluid 114 flows into second passageway portion 150 from other second passageway portions 150. Second passageway portion 150 furcates such that second fluid 114 flows out of second passageway portion 150 towards further second passageway portions 150. In particular, second passageway portion 150 trifurcates such that second fluid 114 flows into three flow paths towards three different second passageway portions 150. Third fluid 118 flows into third passageway portion 152 from other third passageway portions 152. Third passageway portion 152 furcates such that third fluid 118 flows out of third passageway portion 152 towards further third passageway portions 152. In particular, third passageway portion 152 trifurcates such that third fluid 118 flows into three flow paths towards three different third passageway portions 152. First passageway portion 148, second passageway portion 150, and third passageway portion 152 furcate at an approximately 90° angle. In alternative embodiments, first passageway portion 148 and second passageway portion 150 furcate at any angles that enable heat exchanger 100 to operate as described herein.

The furcated shapes of first passageway portion 148, second passageway portion 150, and third passageway portion 152 and the nesting of first passageway portion 148, second passageway portion 150, and third passageway portion 152 provide for additional surface area to facilitate heat exchange between first fluid 110 and second fluid 114. Moreover, the furcation of unit cells 102 reduces and/or inhibits the formation of thermal boundary layers in first fluid 110, second fluid 114, and third fluid 118. For example, thermal and momentum boundary layers are broken up each time first fluid 110, second fluid 114, and third fluid 118 are redirected due to unit cells 102 furcating. Moreover, the repeated furcation in unit cells 102 inhibit first fluid 110, second fluid 114, and third fluid 118 from establishing significant thermal and momentum boundary layers. In alternative embodiments, first passageway portion 148, second passageway portion 150, and third passageway portion 152 have any configuration that enables heat exchanger 100 to operate as described herein.

Moreover, in the exemplary embodiment, first passageway portion 148 and third passageway portion 152 have a square cross-sectional shape, broadly a polygonal cross-sectional shape. Second passageway portion 150 has a square annulus cross-sectional shape, broadly a polygonal annulus cross-sectional shape. In alternative embodiments, first passageway portion 148, second passageway portion 150, and third passageway portion 152 have any cross-sectional shape that enables heat exchanger 100 to operate as described herein. For example, in some embodiments, first passageway portion 148, second passageway portion 150, and/or third passageway portion 152 have any of the following cross-sectional shapes, without limitation: rectangular, diamond, circular, triangular, and annular. In addition, in some embodiments, any of the cross-sectional shapes include blended, rounded, and/or curved portions extending along corners, edges, and/or any other portions of first passageway portion 148, second passageway portion 150, and/or third passageway portion 152. Moreover, in some embodiments, first passageway portion 148, second passageway portion 150, and/or third passageway portion 152 include any of the following, without limitation: a fin, a surface having engineered roughness, a surface roughened by manufacturing process, any other heat transfer enhancement, and combinations thereof.

In the exemplary embodiment, the shape and size of unit cells 102 is determined based at least in part on any of the following, without limitation: surface area, pressure drop, compactness of core 104, and fluid flow. In the exemplary embodiment, unit cells 102 have substantially the same shape. In particular, unit cells 102 have a partially cuboid shape. In alternative embodiments, core 104 includes any unit cells 102 that enable heat exchanger 100 to operate as described herein. In some embodiments, core 104 includes unit cells 102 that differ in configuration from each other. In further embodiments, the shape of unit cells 102 at least partially conforms to a shape of core 104. For example, in some embodiments, unit cells 102 are at least partially curved to align with an annular shape of core 104.

Also, in the exemplary embodiment, first sidewall 126 has a first thickness 154. Second sidewall 128 has a second thickness 156. First thickness 154 and second thickness 156 are substantially constant throughout unit cell 102. In alternative embodiments, unit cell 102 has any wall that enables heat exchanger 100 (shown in FIG. 1) to operate as described herein. For example, in some embodiments, first sidewall 126 and/or second sidewall 128 has a varying thickness.

In addition, in some embodiments, a first width 158 of first passageway portion 148 is defined by first sidewall 126. A second width 160 of second passageway portion 150 is defined between first sidewall 126 and second sidewall 128. In alternative embodiments, unit cell 102 has any width that enables unit cell 102 to function as described herein. For example, in some embodiments, the width of first passageway portion 148 and/or second passageway portion 150 varies.

Moreover, in some embodiments, second sidewall 128 extends a depth 162 from a vertex 164. Depth 162 is equal on all sides of unit cell 102 such that unit cell 102 is symmetric. In alternative embodiments, unit cell 102 has any depth that enables unit cell 102 to function as described herein. For example, in some embodiments, first sidewall 126 and second sidewall 128 extend varying depths.

Also, in the exemplary embodiment, first thickness 154, second thickness 156, first width 158, and second width 160 are determined based on flow requirements, such as flow rate, pressure drop, and heat transfer, and/or volume requirements for heat exchanger 100 as well as pressure containment requirements. In the exemplary embodiment, unit cell 102 is symmetric and other dimensions of unit cell 102 are determined based on first thickness 154, second thickness 156, first width 158, and second width 160. In alternative embodiments, the dimensions of unit cell 102 are determined in any manner that enables unit cell 102 to function as described herein.

Figure 5:
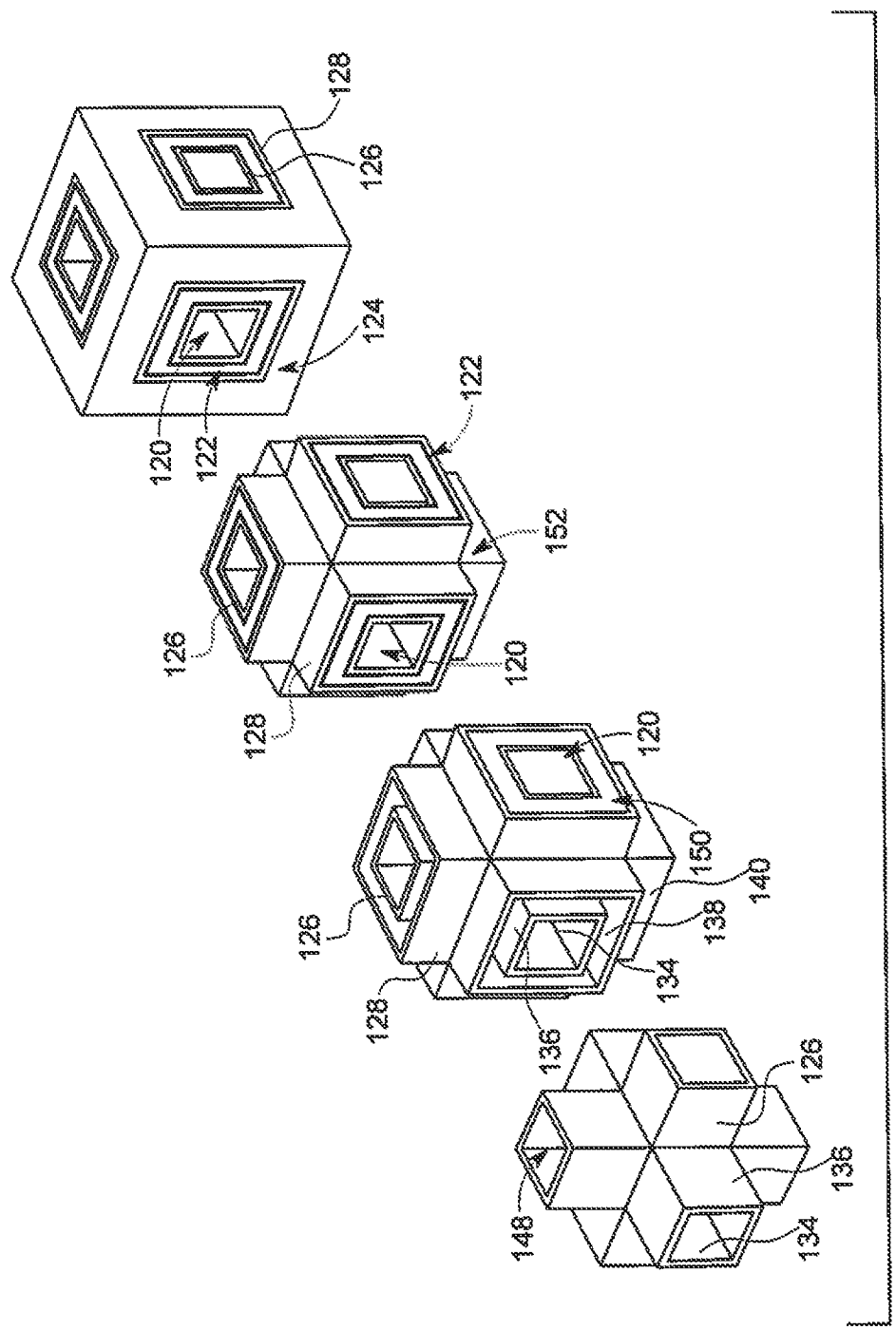
FIG. 5 is a schematic assembly view of the unit cell shown in FIG. 4.

FIG. 5 is a schematic assembly view of unit cell 102. First passageway portion 148 partially forms first fluid domain 120. Second passageway portion 150 partially forms second fluid domain 122. Third passageway portion 152 partially forms third fluid domain 124. First fluid domain 120 is nested within second fluid domain 122. Accordingly, unit cell 102 provides additional surface area between first fluid domain 120 and second fluid domain 122. In addition, first fluid domain 120, second fluid domain 122, and third fluid domain 124 provide for heat exchanger 100 (shown in FIG. 1) to have a lower surface area to volume ratio. In alternative embodiments, unit cell 102 defines any fluid domain that enables heat exchanger 100 (shown in FIG. 1) to operate as described herein.

Figure 6:
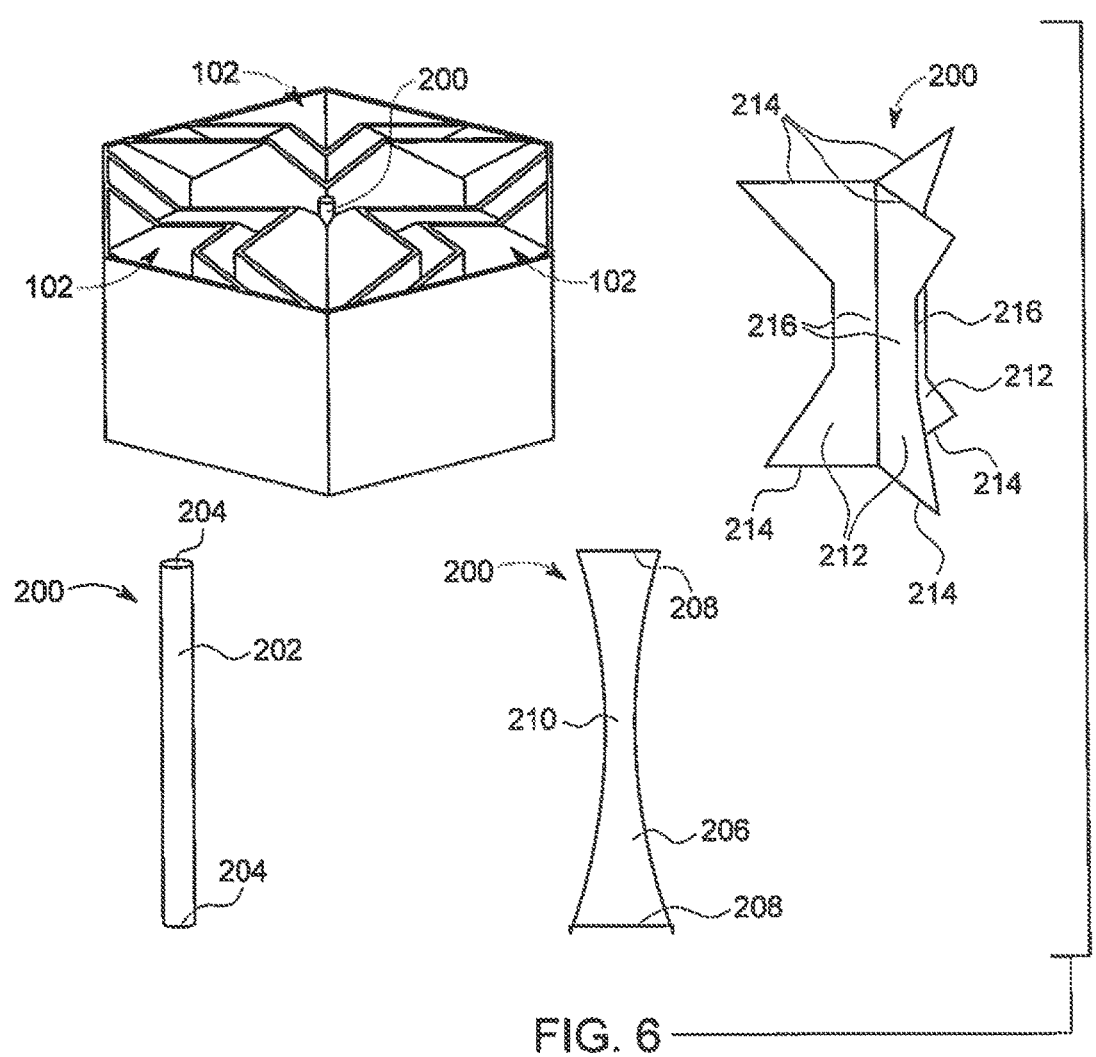
FIG. 6 is a schematic view of exemplary support members for use with the heat exchanger shown in FIG. 1.

FIG. 6 is a schematic view of exemplary support members 200 for use with heat exchanger 100. In particular, each support member 200 couples to and extends between corners of unit cells 102 to support unit cells 102. In addition, each support member 200 is sized and shaped to facilitate fluid flowing past support member 200. In one embodiment, support member 200 includes a column 202 having a cylindrical shape. Ends 204 of column 202 are configured to couple to unit cells 102 such that column 202 extends longitudinally between unit cells 102. In another embodiment, support member 200 includes a column 206 having a tapered shape. Column 206 tapers from a larger cross-sectional area at ends 208 to a smaller cross-sectional area at a middle portion 210. Column 206 is configured to couple to unit cells 102 at ends 208. In another embodiment, support member 200 includes brackets 212. Brackets 212 have wide ends 214 that flare out from narrow middle portions 216. In alternative embodiments, heat exchanger 100 includes any support member 200 that enables heat exchanger 100 to operate as described herein.

Figure 7:
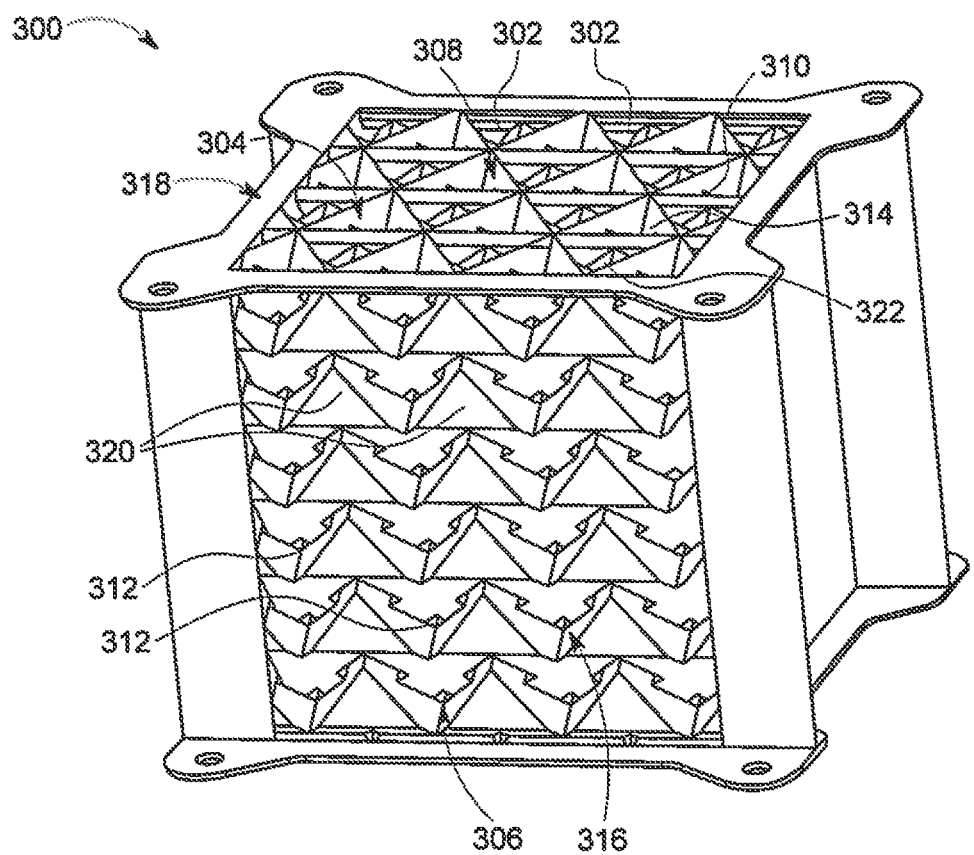
FIG. 7 is a perspective view of an alternative embodiment of a core for use with the heat exchanger shown in FIG. 1.

FIG. 7 is a perspective view of an alternative embodiment of a core 300 for use with heat exchanger 100 (shown in FIG. 1). Core 300 includes a plurality of unit cells 302 defining a first passageway 304, a second passageway 306, and a third passageway 308. Unit cells 302 also define first passageway openings 310, second passageway openings 312, and third passageway openings 314. A first side 316 of core 300 is configured to couple to a manifold portion such that a first fluid is received into second passageway 306 through second passageway openings 312. A second side 318 of core 300 is configured to couple to a manifold portion such that a second fluid is received into first passageway 304 through first passageway openings 310 and into third passageway 308 through third passageway openings 314. Accordingly, first passageway 304 and third passageway 308 are in fluid communication in the manifold portions because first passageway 304 and third passageway 308 open up to common plenums. Within core 300 first passageway 304 and third passageway 308 define separate fluid domains. Moreover, first passageway 304 is nested within second passageway 306. As a result, as the first fluid and the second fluid flow through core 300, the first fluid exchanges heat with second fluid in first passageway 304 and second fluid in third passageway 308. Also, the surface area available for heat transfer is increased. In alternative embodiments, core 300 includes any passageways that enable core 300 to operate as described herein.

In the exemplary embodiment, second passageway 306 is closed by caps 322 on second side 318. First passageway 304 and third passageway 308 are closed by caps 320 on first side 316. Caps 320 and caps 322 inhibit the first fluid and the second fluid mixing at locations where first passageway 304, second passageway 306, and/or third passageway 308 abut manifold portions including a different fluid domain. Also, caps 320 and caps 322 are angled to reduce the amount of material required to produce core 300. In addition, caps 322 provide support to unit cells 302 and reduce unsupported spans of unit cells 302. In alternative embodiments, core 300 includes any cap that enables core 300 to operate as described herein.

Figure 8:
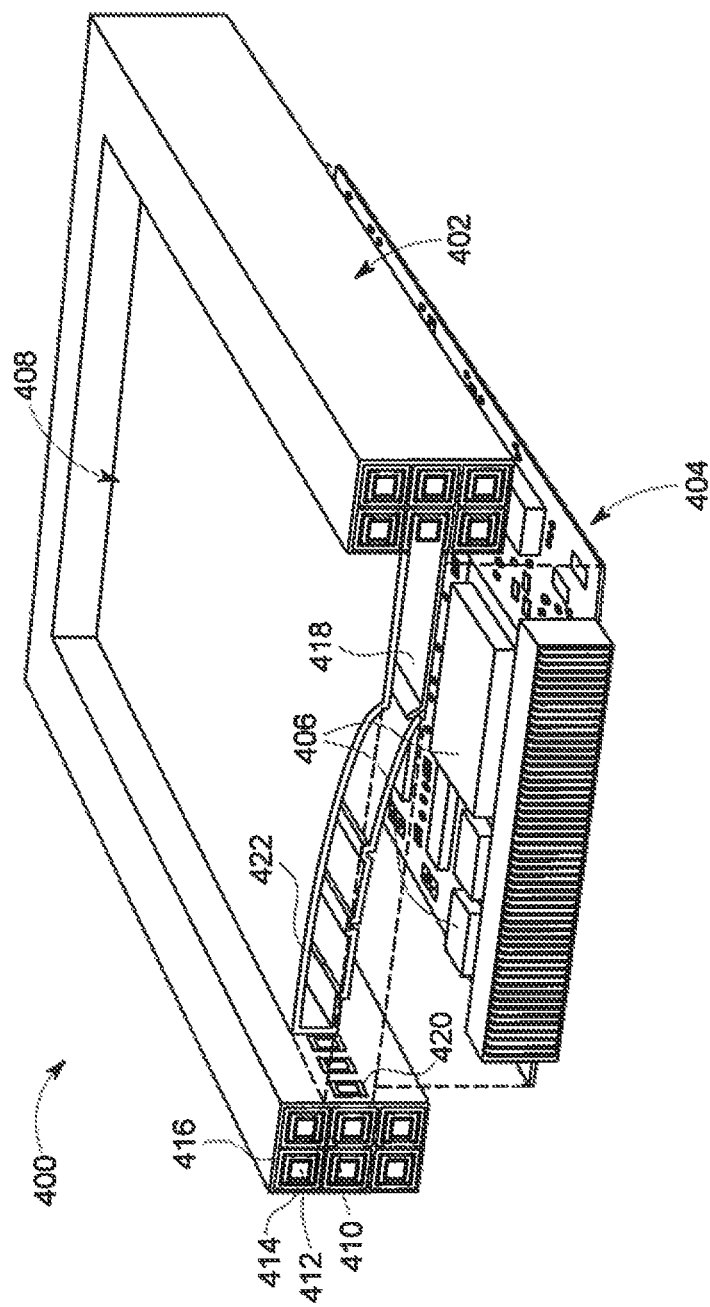
FIG. 8 is a partial sectional perspective view of an exemplary embodiment of an electrical device including a heat exchanger with nested passageways.
Figure 9:
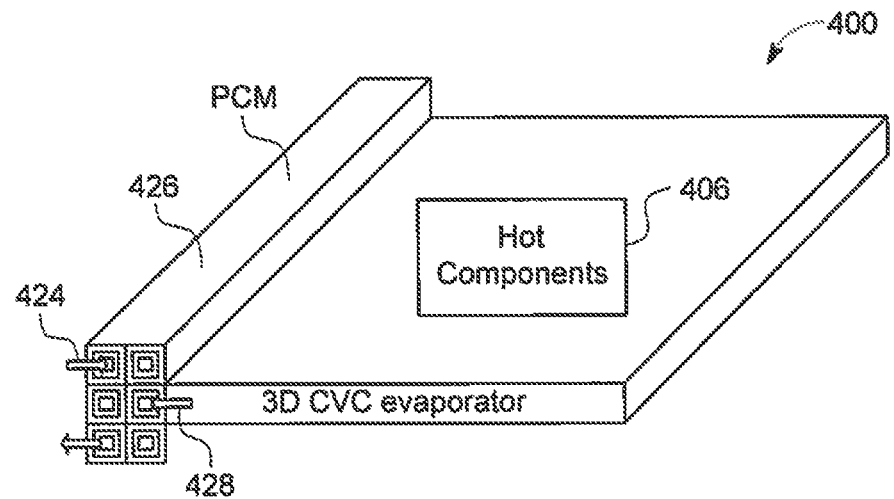
FIG. 9 is a schematic view of the electrical device shown in FIG. 8.

FIG. 8 is a partial sectional perspective view of an exemplary electrical device 400 including a heat exchanger 402 with nested passageways. FIG. 9 is a schematic view of electrical device 400. Electrical device 400 includes heat exchanger 402, a circuit board 404 including electrical components 406, and a three dimensional conformal vapor chamber (3D CVC) 408. In alternative embodiments, electrical device 400 includes any component that enables electrical device 400 to operate as described herein.

In the exemplary embodiment, heat exchanger 402 includes walls 410 that form nested passageways. In particular, walls 410 define a first passageway 412, a second passageway 414, and a third passageway 416. First passageway 412 is nested within second passageway 414 and third passageway 416. Second passageway 414 is nested within third passageway 416. In particular, walls 410 of second passageway 414 encompass first passageway 412. In addition, walls 410 of third passageway 416 encompass first passageway 412 and second passageway 414. In alternative embodiments, heat exchanger 402 includes any passageway that enables heat exchanger 402 to operate as described herein.

Also, in the exemplary embodiment, 3D CVC 408 is coupled to circuit board 404 such that 3D CVC 408 removes heat from electrical components 406. 3D CVC 408 includes an evaporator section 418 and a condenser section 420. In the exemplary embodiment, 3D CVC 408 is an enclosed, hermetic enclosure that has at least some internal surfaces lined with a wicking structure 422. Evaporator section 418 is adjacent electrical components 406 on a center of circuit board 404. Condenser section 420 is coupled to evaporator section 418. Condenser section 420 has a lower temperature than evaporator section 418 to facilitate heat transfer from evaporator section 418 to condenser section 420. In alternative embodiments, 3D CVC 408 has any configuration that enables electrical device 400 to operate as described herein.

In addition, in the exemplary embodiment, heat exchanger 402 and 3D CVC 408 are integrated such that heat exchanger 402 is configured to remove heat directly from evaporator section 418. In particular, second passageway 414 is in fluid communication with 3D CVC 408 and wicking structures 422 extend continuously from second passageway 414 to 3D CVC 408. Wicking structures 422 line at least some walls 410 of heat exchanger 402 that define second passageway 414. In the exemplary embodiment, electrical components 406 transfer heat directly to fluid in passageways of heat exchanger 402.

Also, in the exemplary embodiment, first passageway 412 is configured to contain a cooling fluid 424 to cool walls 410. In some embodiments, cooling fluid 424 is pumped from an exterior of heat exchanger 402. Third passageway 416 is configured to contain a phase change material (PCM) 426. PCM 426 has a phase transition temperature higher than the operating temperature of cooling fluid 424. In alternative embodiments, heat exchanger 402 contains any fluid that enables heat exchanger 402 to operate as described herein. For example, in some embodiments, a single fluid flows through more than one passageway of heat exchanger 402. In further embodiments, heat exchanger 402 includes a first passageway that acts as a condenser of a heat pipe and a second passageway that contains a coolant. In some embodiments, a fluid is contained within a passageway and has a net, bulk average transport velocity that is substantially equal to zero, i.e., the fluid is substantially stationary. In further embodiments, the fluid flows into and/or resides within the passageway such the fluid remains in heat transfer communication with at least one other fluid.

During operation, 3D CVC 408 is evacuated and then charged with a measured amount of working fluid 428, for example distilled water. Due to the low pressure within 3D CVC 408, at least some of working fluid 428 will evaporate until 3D CVC 408 reaches equilibrium due to vapor pressure. When heat is applied to evaporator section 418, such as heat removed from electrical components 406, some working fluid 428 evaporates and absorbs heat from the evaporator. Pressure gradients from the evaporation and condensation process induce vapor of working fluid 428 to move within 3D CVC 408. When the vapor of working fluid 428 reaches condenser section 420, the vapor rapidly condenses and heat is released to condenser 420. Capillary forces within wicking structure 422 draw condensed working fluid 428 back to evaporator section 418 and the cycle is able to repeat.

Also, during operation, 3D CVC 408 extracts heat generated by electronic components 406. PCM 426 remains at a steady state when condenser section 420 is maintained below the phase transition temperature of PCM 426 due to a temperature of cooling fluid 424 and a mass flow within condenser section 420. When the temperature of condenser section 420 reaches approximately the phase transition temperature of the PCM 426, PCM 426 transitions between phases and absorbs heat from evaporator section 418. Such transitions of PCM 426 occur, for example, when evaporator section 418 experiences an increased thermal load and/or cooling fluid 424 has a diminished cooling capacity. Condenser section 420 is maintained substantially at the phase transition temperature until substantially all PCM 426 has transitioned between phases. Heat exchanger 402 has increased surface area for PCM 426 to contact because of the nested structure of first passageway 412, second passageway 414, and third passageway 416. In addition, the efficiency of heat transfer to PCM 426 is increased. As a result, PCM 426 operates under relatively high heat fluxes.

In alternative embodiments, electrical device 400 includes any heat exchanger 402 that enables electrical device 400 to operate as described herein. For example, in some embodiments, a side of heat exchanger 402 is coupled to a manifold (not shown) configured to provide fluid for heat exchanger 402. In further embodiments, a manifold (not shown) is coupled to third passageway 416 and includes an expansion area to allow for changes in volume of PCM 426 as PCM 426 transitions through phases. In some embodiments, third passageway 416 is sealed (e.g., in the case of a reversible PCM 426). In further embodiments, third passageway 416 is vented to the environment (e.g., in the case of an evaporative or ablative PCM 426). In some embodiments, the heat transfer process is reversed, e.g., condenser section 420 has a higher temperature than evaporator section 418 and heat is transferred from condenser section 420 towards evaporator section 418.

In alternative embodiments, 3D CVC 408 is coupled to heat exchanger 402 in any manner that enables electrical device 400 to operate as described herein. For example, in some embodiments, 3D CVC 408 is coupled to any of first passageway 412, second passageway 414, and third passageway 416. In further embodiments, heat exchanger 402 is coupled to any portion(s) of 3D CVC 408. In some embodiments, 3D CVC 408 is coupled to more than one passageway of heat exchanger 402. In further embodiments, 3D CVC 408 is coupled to a plurality of heat exchangers 402.

In some embodiments, at least a portion of heat exchanger 402 includes a vacuum chamber to provide thermal insulation from the environment. For example, in some embodiments, an outermost passageway of heat exchanger 402 is configured as a vacuum chamber and other passageways are nested within the vacuum chamber. In further embodiments, at least a portion of heat exchanger 402 is enclosed by a structure such as shroud configured to form a vacuum chamber.

Figure 10:
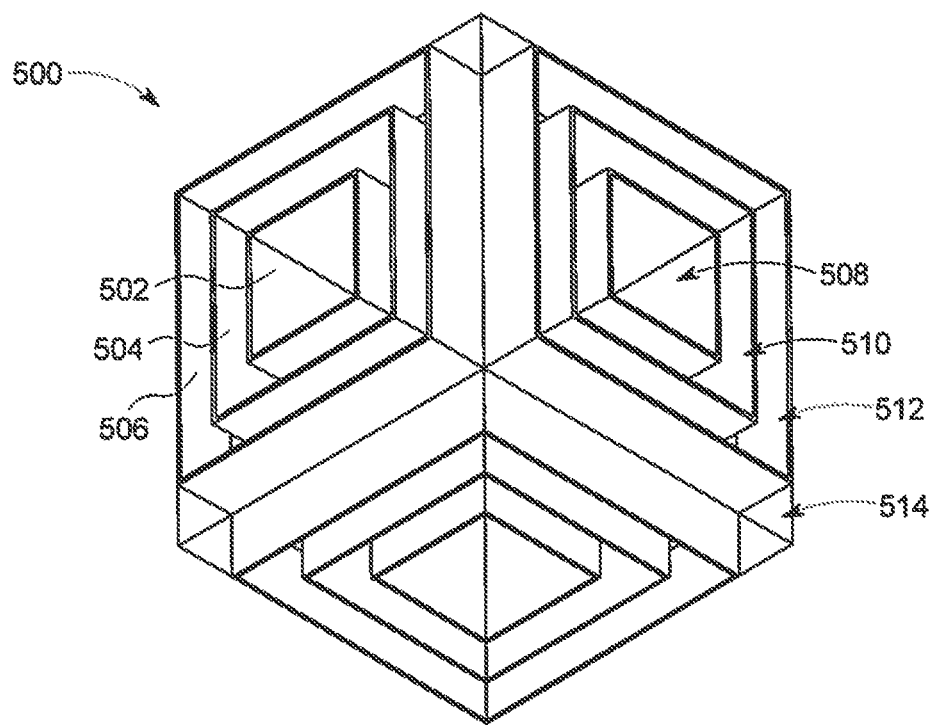
FIG. 10 is an isometric view of an exemplary unit cell for use in the heat exchanger shown in FIG. 1 including a plurality of nested passageway portions.

FIG. 10 is an isometric view of an alternative unit cell 500 for use in heat exchanger 100 (shown in FIG. 1) including a plurality of nested passageway portions. Unit cell 500 includes a first wall 502, a second wall 504, and a third wall 506. First wall 502 defines a first passageway portion 508. Second wall 504 substantially surrounds first wall 502 such that a second passageway portion 510 is defined between second wall 504 and first wall 502 and second passageway portion 510 forms an annulus. Accordingly, first passageway portion 508 is nested within second passageway portion 510. Third wall 506 substantially surrounds second wall 504 such that a third passageway portion 512 is defined between third wall 506 and second wall 504 and third passageway portion 512 forms an annulus. Accordingly, first passageway portion 508 and second passageway portion 510 are nested within third passageway portion 512. In addition, third wall 506 at least partially defines a fourth passageway portion 514. In alternative embodiments, unit cell 500 includes any wall that enables unit cell 500 to function as described herein.

In some embodiments, unit cells 500 are coupled together such that respective passageway portions 508, 510, 512, and 514 are in fluid communication and form continuous passageways. Specifically, first passageway portions 508 are coupled together to form first passageway 508. Second passageway portions 510 are coupled together to form second passageway 510. Third passageway portions 512 are together to form third passageway 512. Fourth passageway portions 514 are coupled together to form fourth passageway 514. In alternative embodiments, unit cells 500 form any passageway that enables unit cells 500 to function as described herein.

Figure 11:
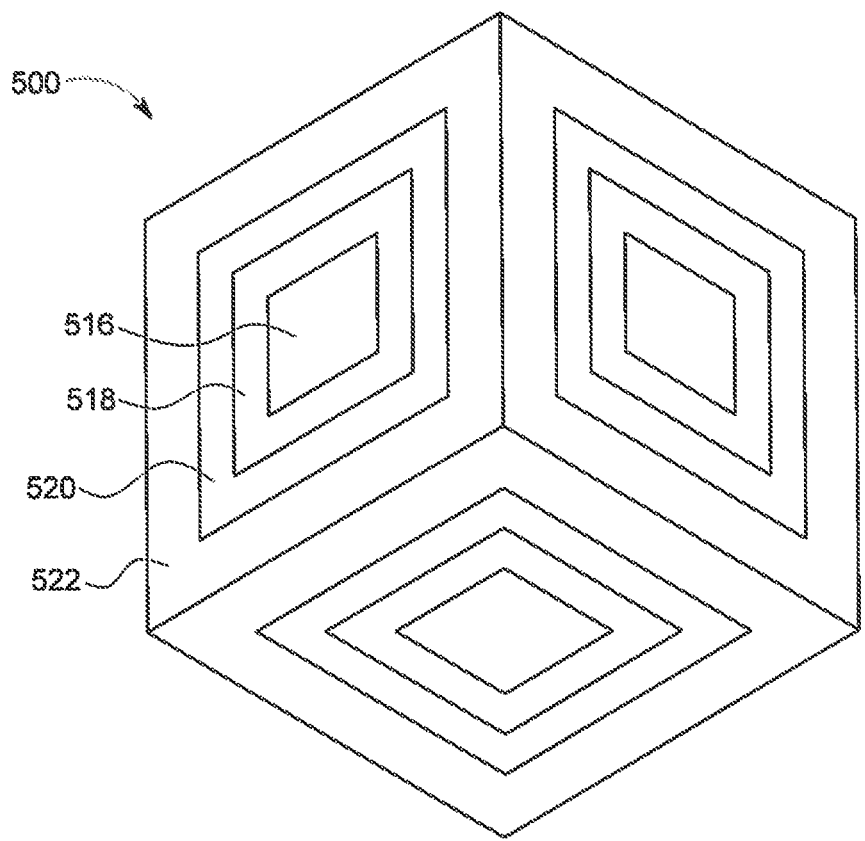
FIG. 11 is a schematic isometric view of fluid domains of the unit cell shown in FIG. 10.

FIG. 11 is a schematic isometric view of fluid domains of unit cell 500. In the exemplary embodiment, unit cell 500 defines a plurality of nested fluid domains. In particular, first passageway portion 508 defines a first fluid domain 516, second passageway portion 510 defines a second fluid domain 518, third passageway portion 512 defines a third fluid domain 520, and fourth passageway portion 514 defines a fourth fluid domain 522. First fluid domain 516 is nested within second fluid domain 518 and third fluid domain 520. Second fluid domain 518 is nested within third fluid domain 520. Accordingly, unit cell 500 has a second-degree nested order. As a result, the ratio of surface are to volume of unit cell 500 is increased in comparison to unit cells without nested fluid domains. In alternative embodiments, unit cell 500 defines any fluid domain that that enables heat exchanger 100 (shown in FIG. 1) to operate as described herein.

Figure 12:
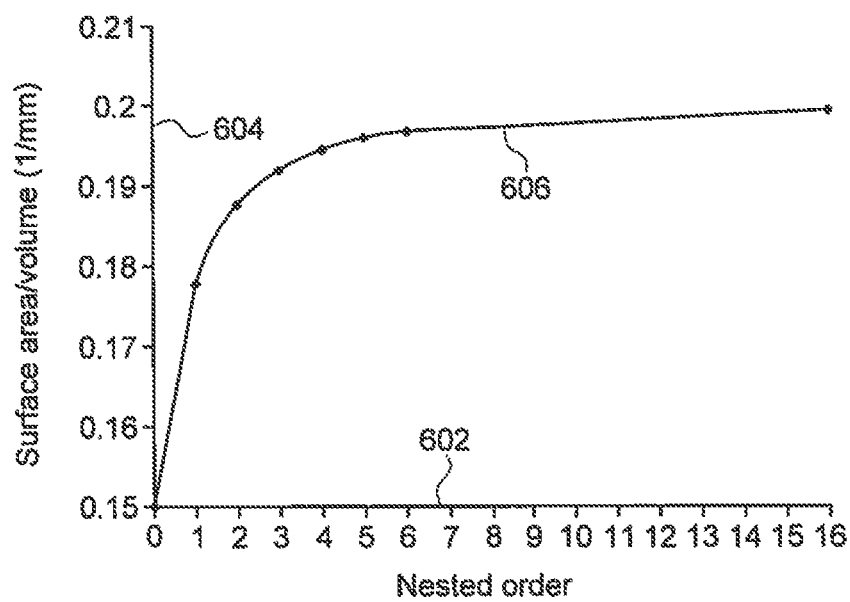
FIG. 12 is an exemplary graphical view of surface area to volume ratios versus nested order for a plurality of heat exchangers.

FIG. 12 is an exemplary graphical view of a surface area to volume ratios versus nested order for a plurality of the heat exchangers 100. As used herein, the term "nested order" refers to the number of nested fluid domains within a unit cell. For example, unit cell 102 (shown in FIG. 4) has a first-degree nested order because unit cell 102 includes a single nested fluid domain. Unit cell 500 (shown in FIG. 10) has a second-degree nested order because unit cell 500 includes two nested fluid domains.

FIG. 12 includes an X-axis 602 indicating nested order (unitless) from 0 to 16. FIG. 12 also includes a Y-axis 604 indicating a ratio of surface area to volume (1/millimeters) from 0.15 to 0.21. FIG. 12 further includes a curve 606 representing surface area to volume ratios for nested orders of heat exchangers. On curve 606, the surface area to volume ratio increases as the nested order increases. Accordingly, a heat exchanger having a nested order of one or greater has an increased ratio of surface area to volume, which facilitates the heat exchanger having an increased efficiency and/or a more compact size than heat exchangers having a zero degree nested order. Curve 606 has the steepest slope up to the first-degree nested order. At approximately a fifth-degree nested order, curve 606 substantially levels out at a ratio of about 0.2 per millimeter. Accordingly, heat exchangers have increased surface area to volume ratios and increased performance up to about a fifth-degree nested order.

The above-described systems and methods include a core that enables heat exchangers to have different shapes, sizes, and flow configurations. The core includes a plurality of unit cells. The unit cells define passageways for at least two different heat exchange fluids such that the fluids combine and divide in close proximity separated only by sidewalls. In addition, the core is configured such that at least some portions of the passageways are nested. For example, in some embodiments, each unit cell defines a first passageway portion that is nested within a second passageway portion. As a result, the core has an increased ratio of surface area to volume ratio. Accordingly, at least some heat exchangers including the core have a decreased volume and increased heat transfer efficiency.

An exemplary technical effect of the methods, systems, and apparatus described herein includes at least one of: (a) increasing heat transfer efficiency of heat exchangers; (b) providing a heat exchanger core capable of use in multiple flow configurations; (c) providing a heat exchanger that is configured to meet system requirements such as size, shape, and piping; (d) increasing the flexibility of heat exchangers; (e) providing heat exchangers with different shapes; (f) reducing volume of heat exchangers; (g) reducing weight of heat exchangers; (h) providing a monolithic structure for use as a heat exchanger core; and (i) decreasing the size of passageways for fluid flow through heat exchanger cores.

Exemplary embodiments of a heat exchanger assembly are described above in detail. The assembly is not limited to the specific embodiments described herein, but rather, components of systems and/or steps of the methods may be utilized independently and separately from other components and/or steps described herein. For example, the configuration of components described herein may also be used in combination with other processes, and is not limited to practice with only heat exchangers and related methods as described herein. Rather, the exemplary embodiments can be implemented and utilized in connection with many applications where furcated passageways for fluid are desired.

Although specific features of various embodiments of the disclosure may be shown in some drawings and not in others, this is for convenience only. In accordance with the principles of the disclosure, any feature of a drawing may be referenced and/or claimed in combination with any feature of any other drawing.

This written description uses examples to disclose the embodiments, including the best mode, and also to enable any person skilled in the art to practice the embodiments, including making and using any devices or systems and performing any incorporated methods. The patentable scope of the disclosure is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A heat exchanger comprising:
a core defining a first passageway and a second passageway, said core comprising:
a plurality of unit cells coupled together, each unit cell of said plurality of unit cells comprising a first wall and a second wall, said second wall spaced from said first wall, said first wall at least partially defining a first passageway portion and a second passageway portion, said second wall at least partially defining said second passageway portion, wherein said second wall extends about said first wall such that said first passageway portion is nested within said second passageway portion, wherein said plurality of unit cells are coupled in flow communication with each other such that at least one unit cell of said plurality of unit cells is configured to receive fluid from at least three other unit cells of said plurality of unit cells.

2. The heat exchanger in accordance with claim 1, wherein said core defines a third passageway, said second wall at least partially defining a third passageway portion.

3. A heat exchanger comprising:
a core defining a first passageway and a second passageway, said core comprising:
a plurality of unit cells coupled together, each unit cell of said plurality of unit cells comprising a first wall and a second wall, said second wall spaced from said first wall, said first wall at least partially defining a first passageway portion and a second passageway portion, said second wall at least partially defining said second passageway portion, wherein said second wall extends about said first wall such that said first passageway portion is nested within said second passageway portion, wherein said core defines a third passageway, said second wall at least partially defining a third passageway portion, and wherein each unit cell of said plurality of unit cells further comprises a third wall, said second wall and said third wall at least partially defining said third passageway portion, wherein said third wall surrounds said second wall such that said second passageway portion is nested within said third passageway portion.

4. The heat exchanger in accordance with claim 1, wherein said second wall surrounds said first wall such that said second passageway portion forms an annulus.

5. The heat exchanger in accordance with claim 4, wherein said second passageway portion has a polygonal annulus cross-sectional shape.

6. The heat exchanger in accordance with claim 2 further comprising a manifold portion for a first fluid and a second fluid to flow through, wherein said core is coupled to said manifold portion such that the first fluid flows through at least one of said first passageway and said third passageway and such that the second fluid flows through said second passageway.

7. The heat exchanger in accordance with claim 6, wherein said plurality of unit cells are configured such that the first fluid and the second fluid flow through said core in at least one of the following flow configurations: counter-flow, parallel flow, cross-flow, and hybrid flow.

8. The heat exchanger in accordance with claim 6, wherein said manifold portion is configured for a third fluid to flow through, wherein said core is coupled to said manifold portion such that the first fluid flows through said first passageway and the third fluid flows through said third passageway.

9. The heat exchanger in accordance with claim 1, wherein said first wall defines at least one first inlet for fluid to enter said first passageway portion and at least one first outlet for fluid to exit said first passageway portion.

10. The heat exchanger in accordance with claim 9, wherein said first wall and said second wall define at least one second inlet for fluid to enter said second passageway portion and at least one second outlet for fluid to exit said second passageway portion.

11. The heat exchanger in accordance with claim 2, wherein said first passageway and said third passageway are coupled to a plenum such that said first passageway is in fluid communication with said third passageway.

12. The heat exchanger in accordance with claim 1, wherein said second passageway is configured to contain a stationary fluid such that the stationary fluid resides within said second passageway and is in heat transfer communication with a fluid flowing through at least one of said first passageway and said second passageway.

13. A heat exchanger comprising:
a core defining a first passageway for a first fluid to flow through and a second passageway for a second fluid to flow through, said core comprising:
a first unit cell comprising a first sidewall and a second sidewall, said first sidewall at least partially defining a first passageway first portion and a second passageway first portion, said second sidewall at least partially defining said second passageway first portion, wherein said second sidewall extends about said first sidewall such that said first passageway first portion is nested within said second passageway first portion; and
a second unit cell comprising a third sidewall at least partially defining a first passageway second portion and a second passageway second portion, said second unit cell coupled to said first unit cell, wherein said first unit cell is configured to enable the first fluid to flow from said first passageway first portion to said first passageway second portion, wherein said second unit cell further comprises a fourth sidewall, said fourth sidewall at least partially defining said second passageway second portion, wherein where said first passageway second portion is nested within said second passageway second portion.

14. The heat exchanger in accordance with claim 13, wherein said core further defines a third passageway, said first unit cell further comprising a fourth sidewall at least partially defining said second passageway first portion and a third passageway first portion, wherein said second passageway first portion is nested within said third passageway first portion.

15. The heat exchanger in accordance with claim 14, wherein said third passageway is in fluid communication with said first passageway.

16. The heat exchanger in accordance with claim 14 further comprising a manifold portion for a first fluid and a second fluid to flow through, wherein said core is coupled to said manifold portion such that the first fluid flows through at least one of said first passageway and said third passageway and the second fluid flows through said second passageway.

17. The heat exchanger in accordance with claim 13, wherein said second sidewall surrounds said first sidewall such that said second passageway first portion forms an annulus.

18. The heat exchanger in accordance with claim 13, wherein said second passageway first portion has a polygonal annulus cross-sectional shape.

* * * * *